(12) United States Patent  (10) Patent No.: US 7,759,961 B2
Sylvester  (45) Date of Patent: Jul. 20, 2010

(54) BALL GRID ARRAY CONNECTION MONITORING SYSTEM AND METHOD

(75) Inventor: Jeffry S. Sylvester, Houston, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 12/484,578

(22) Filed: Jun. 15, 2009

(65) Prior Publication Data

US 2009/0251166 A1 Oct. 8, 2009

Related U.S. Application Data

(63) Continuation of application No. 11/411,541, filed on Apr. 26, 2006, now Pat. No. 7,573,282.

(51) Int. Cl.
*G01R 31/26* (2006.01)

(52) U.S. Cl. .................................................. 324/765

(58) Field of Classification Search ................ None
See application file for complete search history.

(56) References Cited

U.S. PATENT DOCUMENTS

| | | | |
|---|---|---|---|
| 5,859,538 A | 1/1999 | Self | |
| 5,896,037 A | 4/1999 | Kudla et al. | |
| 5,955,888 A * | 9/1999 | Frederickson et al. | 324/761 |
| 6,104,198 A | 8/2000 | Brooks | |
| 6,204,676 B1 | 3/2001 | Hsieh et al. | |
| 6,389,558 B1 | 5/2002 | Herrmann et al. | |
| 6,523,136 B1 | 2/2003 | Higashida | |
| 6,525,553 B1 | 2/2003 | Reynoso et al. | |
| 6,590,409 B1 | 7/2003 | Hsiung et al. | |
| 6,704,889 B2 | 3/2004 | Herrmann et al. | |
| 6,717,415 B2 | 4/2004 | Sunter | |
| 6,809,537 B2 | 10/2004 | Adams | |
| 6,879,173 B2 | 4/2005 | Barr et al. | |
| 6,895,353 B2 | 5/2005 | Barr et al. | |
| 6,995,581 B2 * | 2/2006 | Barr et al. | 324/763 |
| 7,202,685 B1 | 4/2007 | Bartley et al. | |
| 7,210,081 B1 | 4/2007 | Euzent et al. | |
| 7,365,552 B2 | 4/2008 | Sheeran | |
| 7,573,282 B2 * | 8/2009 | Sylvester | 324/765 |
| 2001/0037477 A1 | 11/2001 | Veenstra et al. | |
| 2004/0246008 A1 * | 12/2004 | Barr et al. | 324/719 |
| 2007/0115004 A1 | 5/2007 | Mirov et al. | |
| 2007/0252612 A1 * | 11/2007 | Sylvester | 324/765 |
| 2009/0015285 A1 | 1/2009 | Farooq et al. | |

* cited by examiner

*Primary Examiner*—Jermele M Hollington

(57) ABSTRACT

A system for monitoring the connection on an integrated circuit ball grid array (BGA) comprises a connection indicator circuit coupled to at least one monitor pin of the BGA and configured to detect a pin connection failure of the BGA based on a signal change associated with the at least one monitor pin.

12 Claims, 3 Drawing Sheets

BALL GRID ARRAY CONNECTION MONITORING SYSTEM AND METHOD

CROSS-REFERENCE TO RELATED APPLICATIONS

This is a Continuation of U.S. patent application Ser. No. 11/411,541 entitled "BALL GRID ARRAY CONNECTION MONITORING SYSTEM AND METHOD," filed Apr. 26, 2006 now U.S. Pat. No. 7,573,282, by Jeffry S. Sylvester, and assigned to the present assignee.

BACKGROUND OF THE INVENTION

Ball grid arrays (BGAs) disposed on integrated circuits (e.g., especially used on high pin count application specific integrated circuits (ASICs)) comprise beads of solder between two generally circular pads for attaching the integrated circuit to a printed circuit board (PCB). However, flexing and/or other stresses imposed on the PCB can cause the soldered ball joints to crack, thereby causing various pins of the integrated circuit to become detached or otherwise loosened from the PCB. In order to reduce the failures associated with cracked solder ball joints, corner balls are replaced with dummy balls that are not used by the integrated circuit. Thus, if the corner dummy balls become cracked, loosened, or are otherwise damaged, performance of the integrated circuit is not compromised. However, damage is not necessarily limited to the corner solder ball joints. For example, although a cracked solder ball joint may initially occur at the corner of the BGA, the cracking condition tends to propagate inward toward the center of the BGA, thereby compromising non-dummy solder ball locations of the integrated circuit.

BRIEF DESCRIPTION OF THE DRAWINGS

For a more complete understanding of the present invention, and the objects and advantages thereof, reference is now made to the following descriptions taken in connection with the accompanying drawings in which.

DETAILED DESCRIPTION OF THE DRAWINGS

The preferred embodiments of the present invention and the advantages thereof are best understood by referring to FIGS. 1-4 of the drawings, like numerals being used for like and corresponding parts of the various drawings.

Figure 1:
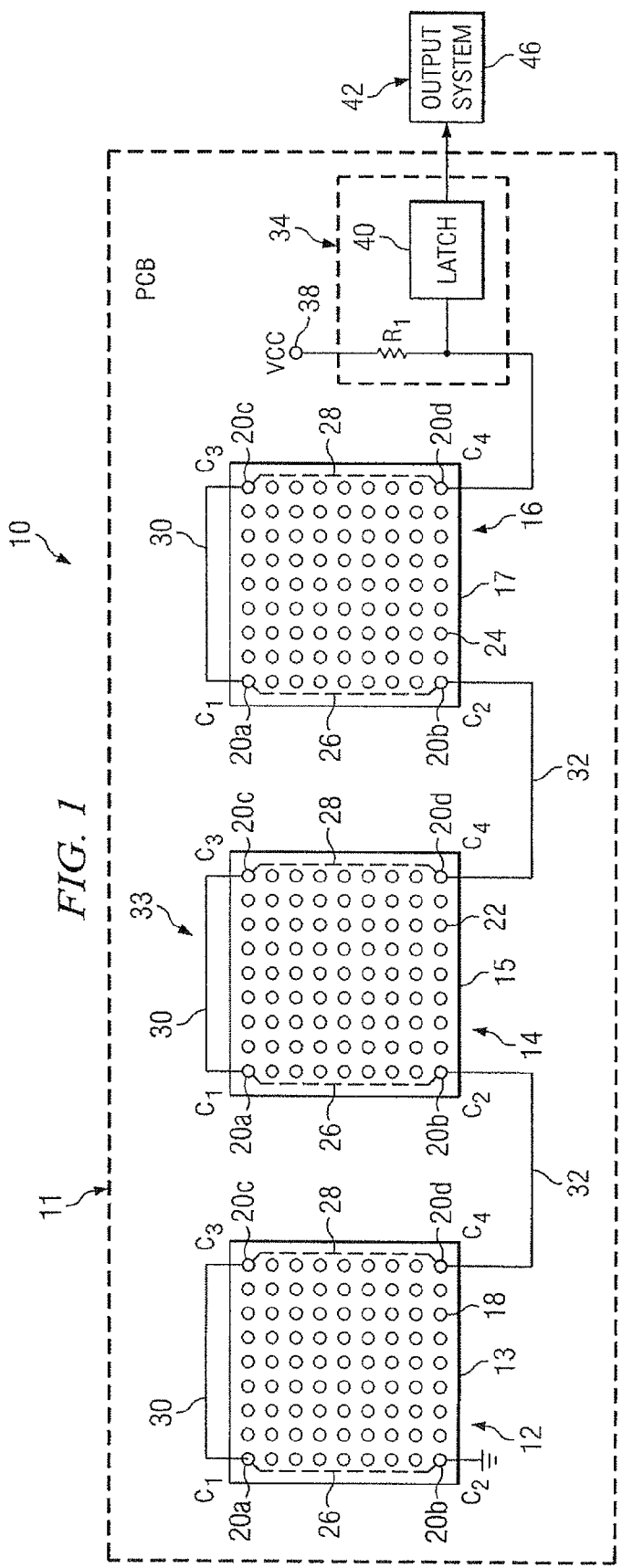
FIG. 1 is a diagram illustrating an embodiment of a ball grid array connection monitoring system in accordance with the present invention.

FIG. 1 is a diagram illustrating an embodiment of a ball grid array (BGA) connection monitoring system 10 in accordance with the present invention. In the embodiment illustrated in FIG. 1, monitoring system 10 is used to monitor the electrical connection of three integrated circuits 12, 14 and 16 disposed on a printed circuit board (PCB) 11 to detect a connection failure or impending connection failure of a solder joint between one of integrated circuits 12, 14 and 16 with PCB 11 (failure meaning a loss of connection or intermittent loss of connection between at least a portion of integrated circuit 12, 14, or 16 with the PCB 11 due to cracking or other damage to one or more solder ball joints). It should be understood that monitoring system 10 may be used to monitor a greater or fewer number of integrated circuits disposed on PCB 11. In the embodiment illustrated in FIG. 1, integrated circuits 12, 14 and 16 comprise application specific integrated circuits (ASICs) 13, 15 and 17. However, it should be understood that other types of integrated circuits 12, 14, and 16 may be monitored using system 10.

In the embodiment illustrated in FIG. 1, ASIC 13 comprises a BGA 18 comprising solder monitor pins 20a, 20b, 20c and 20d disposed on each corner C1, C2, C3 and C4, respectively, of ASIC 13. Although embodiments of the present invention illustrate a single monitor pin 20a, 20b, 20c and 20d disposed at each corner C1, C2, C3 and C4, respectively, it should be understood that 1) a greater number of monitor pins may be used at each corner C1, C2, C3, and C4, 2) monitoring pins may be used at other non-corner locations of ASIC 13, and/or 3) one or more corners C1, C2, C3 or C4 may have no monitoring pins. Similarly, ASIC 15 and ASIC 17 comprise BGA 22 and 24, respectively, with monitor pins 20a-20d disposed on each corner C1, C2, C3 and C4, respectively.

In the embodiment illustrated in FIG. 1, monitor pins 20a and 20b for each respective ASIC 13, 15 and 17 are connected together via a conductive path 26, and monitor pins 20c and 20d of each respective ASIC 13, 15 and 17 are connected together via a conductive path 28; however, it should be understood that conductive paths 26 and 28 may extend between any two monitor pins 20a, 20b, 20c, or 20d. For example, monitor pin 20a and 20d may be connected together via a conductive path, and monitor pins 20b and 20c may be connected together via a conductive path. Preferably, conductive paths between monitor pins 20 are disposed directly on each ASIC 13, 15 and 17; however, it should be understood that conductive paths between monitor pins 20 may be otherwise located (e.g., disposed directly on a PCB 11 to connect the respective monitor pins 20a, 20b, 20c and 20d). In the embodiment illustrated in FIG. 1, conductive paths 26 and 28 corresponding to each respective ASIC 13, 15 and 17 are connected together via respective conductive paths 30. Additionally, conductive path 28 on ASIC 13 is connected to conductive path 26 on ASIC 15, and conductive path 28 on ASIC 15 is connected to conductive path 26 on ASIC 17, via conductive paths 32. Although conductive paths 30 and 32 are illustrated in FIG. 1 as being external to ASICs 13, 15 and 17 (e.g., disposed directly on PCB 11), it should be understood that conductive paths 30 and/or 32 may be otherwise located (e.g., disposed directly on each ASIC 13, 15 and/or 17). In the embodiment illustrated in FIG. 1, conductive paths 26, 28, 30 and 32 connect monitor pins 20a, 20b, 20c, and 20d for each ASIC 13, 15 and 17 in series, thereby forming a continuous conductive path 33 (e.g., formed by paths 26, 28, 30 and 32) through each monitor pin 20a-20d on respective ASICs 13, 15, and 17.

In the embodiment illustrated in FIG. 1, system 10 further comprises a connection indicator circuit 34 comprising a pull-up resistor R1 connected to a power rail 38 and a latch 40. Latch 40 is configured to change its output state based on the input signal received from monitor pins 20a-20d. An output system 42 is communicatively coupled to latch 40 for generating and/or otherwise sends a signal indicative of a pin connection failure. In the embodiment illustrated in FIG. 1, output system 42 comprises an external computer device 46 usable during production/testing and/or otherwise so that a board designer/manufacturer is notified of a pin connection failure. Output system 42 may also comprise an onboard system (e.g., disposed on and/or otherwise forming part of PCB 11). Computer device 46 may also comprises the computer in which PCB 11 is installed, thereby providing a visual or other type of indication of a system failure. Output system 42 may also be configured to set a flag in a flash memory of PCB 11 to facilitate logging and tracking of pin connection failures.

In operation, conductive path 33 is grounded at monitor pin 20b of ASIC 13. Thus, if any monitor pin 20a, 20b, 20c and/or 20d of ASIC 13, 15 or 17 fails, or in the event of impending failure (e.g., the connection becomes intermittent), current will be prevented from flowing along path 33 (e.g., the circuit will open). Accordingly, the signal will be pulled up via a pull-up resistor R1 causing latch 40 to change its output state, thereby indicating that a pin connection failure has occurred. Output from latch 40 is sent to computer device 46 for providing notification of the pin connection failure.

Figure 2:
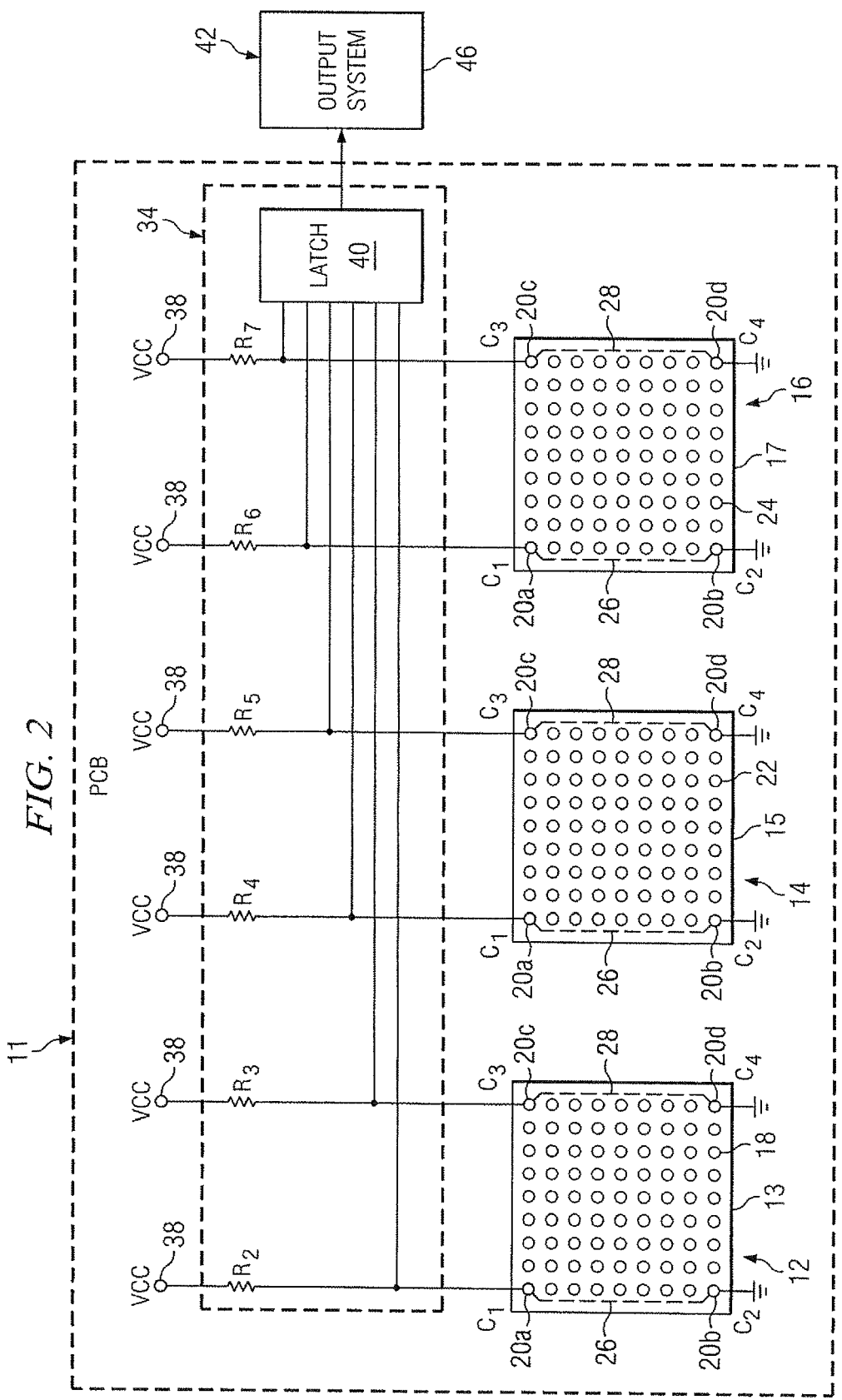
FIG. 2 is a diagram illustrating another embodiment of a ball grid array connection monitoring system in accordance with the present invention.

FIG. 2 is a diagram illustrating another embodiment of a BGA connection monitoring system 10 in accordance with the present invention corresponding to integrated circuits 12, 14 and 16. In the embodiment illustrated in FIG. 2, connection monitoring system 10 comprises conductive paths 26 and 28 associated with ASICs 13, 15 and 17 connecting monitor pins 20a to monitor pins 20b, and connecting monitor pins 20c to monitor pins 20d, respectively. Connection indicator circuit 34 comprises pull-up resistors R2, R3, R4, R5, R6 and R7 connected to respective conductive paths 26 and 28, and latch 40 connected to each respective conductive path 26 and 28. In the embodiment illustrated in FIG. 2, each conductive path 26 and 28 is coupled separately to connection indicator module 34 and is individually grounded at respective monitor pins 20b and 20d. In operation, if any of monitor pins 20a, 20b, 20c or 20d develops a crack or otherwise fails, current across a respective path 26 and/or 28 will stop flowing, thereby causing the signal to be pulled up via a respective pull-up resistors R2, R3, R4, R5, R6 or R7 and causing a change in the output state of latch 40. For example, in the event that monitor pin 20b on ASIC 15 develops a crack, the cracked solder joint will cause an open circuit and preventing current flow. Accordingly, the signal will be pulled up via pull-up resistor R4, thereby changing the state of latch 40 to indicate that a failure has occurred in either monitor pin 20a and/or 20b of ASIC 15. System 42 receives output generated by latch 40 to provide a notification of the connector pin failure.

Figure 3:
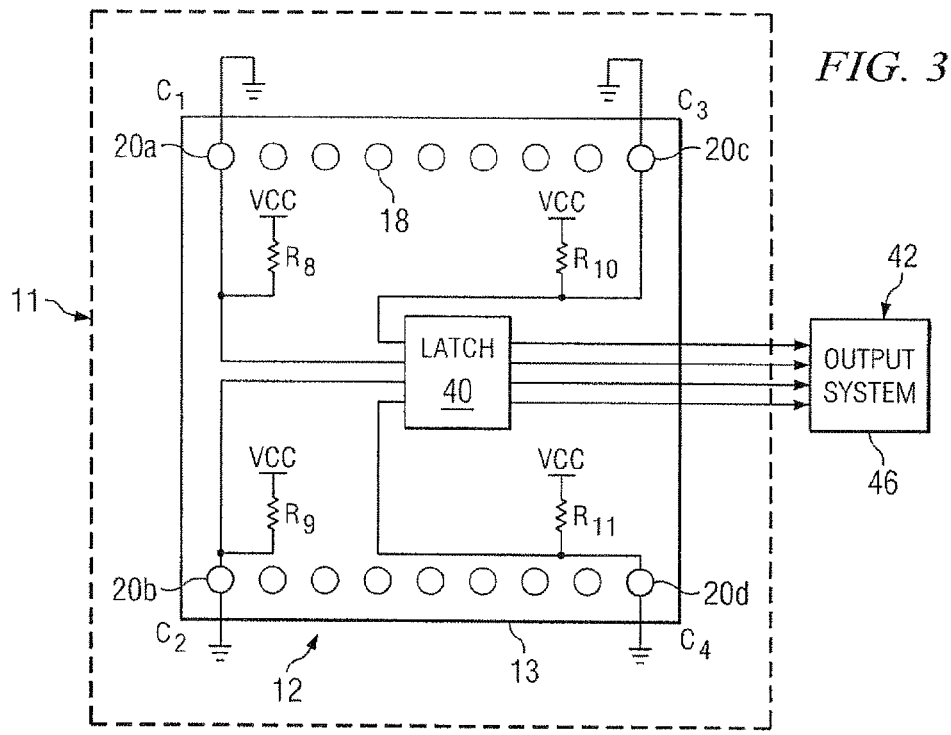
FIG. 3 is a diagram of yet another embodiment of a ball grid array connection monitoring system in accordance with the present invention.

FIG. 3 is a diagram illustrating yet another embodiment of BGA connection monitoring system 10 in accordance with the present invention corresponding to integrated circuit 12. In the embodiment illustrated in FIG. 3, monitoring system 10 is disposed directly on ASIC 13; however, it should be understood that monitoring system 10 may also be disposed on ASIC 15 and/or 17. In the embodiment illustrated in FIG. 3, ASIC 13 comprises BGA 18, monitor pins 20a, 20b, 20c and 20d disposed on corners C1, C2, C3 and C4, internal pull-up resistors R8, R9, R10 and R11 coupled to respective monitor pins 20a-20d, and a latch 40. In the embodiment illustrated in FIG. 3, each monitor pin 20a-20d is grounded to PCB 11 and coupled to respective internal pull-up resistors R8, R9, R10 and R11. In operation, if a particular monitor pin 20a, 20b, 20c or 20d fails, the circuit will open and the signal will be pulled up via a respective pull-up resistor R8, R9, R10 or R11, thereby changing the output state of latch 40 to indicate that a failure has occurred at the specific corner C1, C2, C3 or C4 where the respective monitor pin 20a-20d is disposed. Thus, embodiments of the present invention enable monitoring each of monitor pins 20a, 20b, 20c and 20d independently. Output system 42 receives the signal from latch 40 to indicate a failure of the particular monitor pin(s) 20a-20d.

Figure 4:
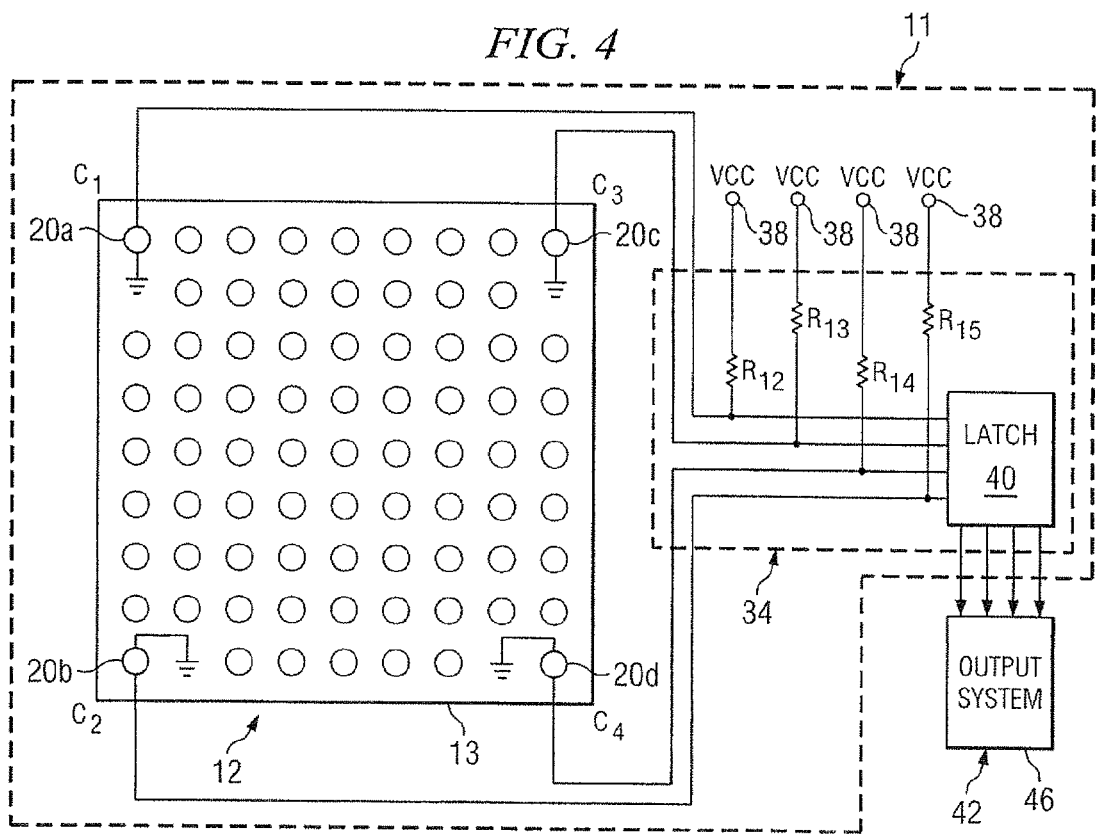
FIG. 4 is a diagram of yet another embodiment of a ball grid array connection monitoring system in accordance with the present invention.

FIG. 4 is a diagram of yet another embodiment of BGA connection monitoring system 10 in accordance with the present invention corresponding to integrated circuit 12. In the embodiment illustrated in FIG. 4, ASIC 13 comprises monitor pins 20a-20d disposed at respective corners C1-C4. Each monitor pin 20a-20d is grounded internally via ASIC 13. In the embodiment illustrated in FIG. 4, monitoring system 10 comprises connection indicator circuit 34 comprising pull-up resistors R12, R13, R14 and R15 connected to a power rail 38, latch 40 and respective monitor pins 20a-20d. In operation, if a particular monitor pin 20a-20d fails, the circuit will open and the signal will be pulled up via a respective pull-up resistor R12, R13, R14 or R15, thereby changing the output state of latch 40 to indicate that a failure has occurred at the specific corner C1, C2, C3 or C4 corresponding to the particular monitor pin 20a-20d. Output system 42 receives a signal from latch 40 to indicate a failure of the particular monitor pins 20a-20d.

Thus, embodiments of the present invention enable the solder joints of a BGA to be monitored during manufacturing/testing, during field use and/or otherwise to detect whether a cracked solder joint exists on a particular BGA. In the embodiments described above, monitoring system 10 is configured such that an increase in voltage is used to indicate a connection failure (e.g., pulled up to a particular voltage level by a pull-up resistor). However, it should be understood that the connection loss may be otherwise determined (e.g., by a decrease in voltage level or otherwise).

What is claimed is:

1. A method for monitoring an integrated circuit ball grid array (BGA) connection, comprising:
    monitoring a signal on an electrical line connected to at least one monitor pin of the BGA, the at least one monitor pin coupled to a ground;
    detecting a pin connection failure of the BGA by detecting a signal change on the electrical line associated with the at least one monitor pin; and
    indicating a pin connection failure associated with the at least one monitor pin in response to a change in the signal on the electrical line.

2. The method of claim 1, further comprising locating the at least one monitor pin at a corner of the BGA.

3. The method of claim 1, further comprising detecting a pin connection failure corresponding to at least one of a plurality of monitor pins of the BGA.

4. The method of claim 1, further comprising indicating a pin connection failure based on a voltage increase associated with a conductive path corresponding to the at least one monitor pin.

5. The method of claim 1, further comprising monitoring an output signal of a latch coupled to a conductive path of the electrical line associated with the at least one monitor pin.

6. The method of claim 1, further comprising generating an output signal indicative of a pin connection failure.

7. The method of claim 1, further comprising electrically coupling the at least one monitor pin to another monitor pin of the BGA, the at least one monitor pin and the another monitor pin disposed on different corners of the BGA.

8. The method of claim 1, wherein the ground is connected through another pin on the BGA.

9. A system for monitoring the connection on an integrated circuit ball grid array (BGA), comprising:
- means for monitoring a signal on an electrical line corresponding to at least one monitor pin of the BGA, the at least one monitor pin coupled to a ground;
- means for detecting a pin connection failure of the BGA by detecting a signal change on the electrical line associated with the at least one monitor pin; and
- means for indicating a pin connection failure associated with the at least one monitor pin in response to a change in the signal.

10. The system of claim 9, wherein the monitoring means comprises means for monitoring a signal corresponding to at least one monitor pin disposed at a corner of the BGA.

11. The system of claim 9, further comprising means for detecting an increase in voltage associated with a conductive path of the electrical line corresponding to the at least one monitor pin.

12. The system of claim 9, where the means for monitoring the signal is disposed in an integrated circuit coupled to the BGA.

* * * * *